United States Patent
Takata et al.

[11] Patent Number: 5,828,596
[45] Date of Patent: Oct. 27, 1998

[54] SEMICONDUCTOR MEMORY DEVICE

[75] Inventors: Hidekazu Takata, Nara-ken, Japan; Thomas Mnich, Woodland Park, Colo.; David Novosel, New Wilmington, Pa.

[73] Assignee: Sharp Kabushiki Kaisha, Osaka, Japan

[21] Appl. No.: 723,949

[22] Filed: Sep. 26, 1996

[51] Int. Cl.$^6$ ............................................. G11C 11/22
[52] U.S. Cl. .................. 365/145; 365/189.05; 365/226
[58] Field of Search ................................ 365/145, 226, 365/189.05

[56] References Cited

U.S. PATENT DOCUMENTS 5,455,786 10/1995 Takeuchi et al. .................. 365/149 X
5,539,279 7/1996 Takeuchi et al. ...................... 365/145

FOREIGN PATENT DOCUMENTS

3-283176 12/1991 Japan .
7-182872 7/1995 Japan .

*Primary Examiner*—Do Hyun Yoo

[57] ABSTRACT

A semiconductor memory device includes a ferroelectric memory having a non-volatile operation mode and a volatile operation mode; an input terminal to which an input signal indicating a voltage level of a power source voltage is input; a first signal generating circuit outputting a first control signal for regulating activation and inactivation of the non-volatile operation mode to the ferroelectric memory; and a second signal generating circuit outputting a second control signal for regulating the activation and inactivation of the non-volatile operation mode to the first signal generating circuit, based on the input signal. The non-volatile operation mode and the volatile operation mode are automatically switched with each other in accordance with changes in the voltage level of the power source voltage under a first operation condition, and only the volatile operation mode is activated under a second operation condition.

6 Claims, 4 Drawing Sheets

SEMICONDUCTOR MEMORY DEVICE

BACKGROUND OF THE INVENTION

1. Field of the Invention

The present invention relates to a semiconductor memory device, and particularly to a ferroelectric memory having a non-volatile operation mode and a volatile operation mode. More specifically, the present invention relates to a ferroelectric memory which works as a volatile memory (i.e., as a DRAM) to read and write information during normal operation and works as a non-volatile memory to write information and read written information upon power-on and power-off.

2. Description of the Background

A ferroelectric memory generally uses a ferroelectric capacitor including a ferroelectric film made of a ferroelectric material as a memory element. When operating as a non-volatile memory, the ferroelectric memory uses a polarization inversion phenomenon unique to the ferroelectric material, thereby writing and reading data. However, as the quantity of written data increases, the ferroelectric film included in the ferroelectrlc capacitor fatigues, in some cases, resulting in degradation of polarization retention characteristics of the ferroelectric film.

In order to overcome the above-mentioned problem, it is considered that data is read and written without using the polarization inversion phenomenon. More specifically, the ferroelectric memory is allowed to work as a volatile memory (i.e., as a DRAM) during normal operation, which writes and reads data using the accumulation and discharge of electric charges, without utilizing the polarization inversion phenomenon. On the other hand, the ferroelectric memory is set in a non-volatile operation mode at power-on and power-off, thereby working as a non-volatile memory which utilizes the polarization inversion phenomenon.

In addition, while operating like a normal DRAM under the volatile operation mode, the stored information is refreshed to cause directions of polarization in the ferroelectric film to be periodically inverted. The direction of polarization functions as non-volatile information to be used together with volatile information which is stored based on the accumulation and discharge of the electric charges.

Thus, by appropriately switching between the volatile operation mode and the non-volatile operation mode to reduce the number of occurrences of the polarization inversion, fatigue of the ferroelectric film due to the polarization inversion phenomenon and the resultant degradation of operational characteristics of a memory are reduced.

A semiconductor memory device using a ferroelectric capacitor as a memory element which is configured to be capable of selecting the non-volatile operation mode and the volatile operation mode is disclosed, for example, in Japanese Laid-Open Patent Publication No. 7-182872. In the configuration disclosed therein, upon automatically detecting the increase in a power source voltage, the non-volatile operation mode is selected. Thereafter, the volatile operation mode is then selected in accordance with a switching signal, so that the semiconductor memory can be operated as a volatile memory such as a DRAM.

Figure 6:
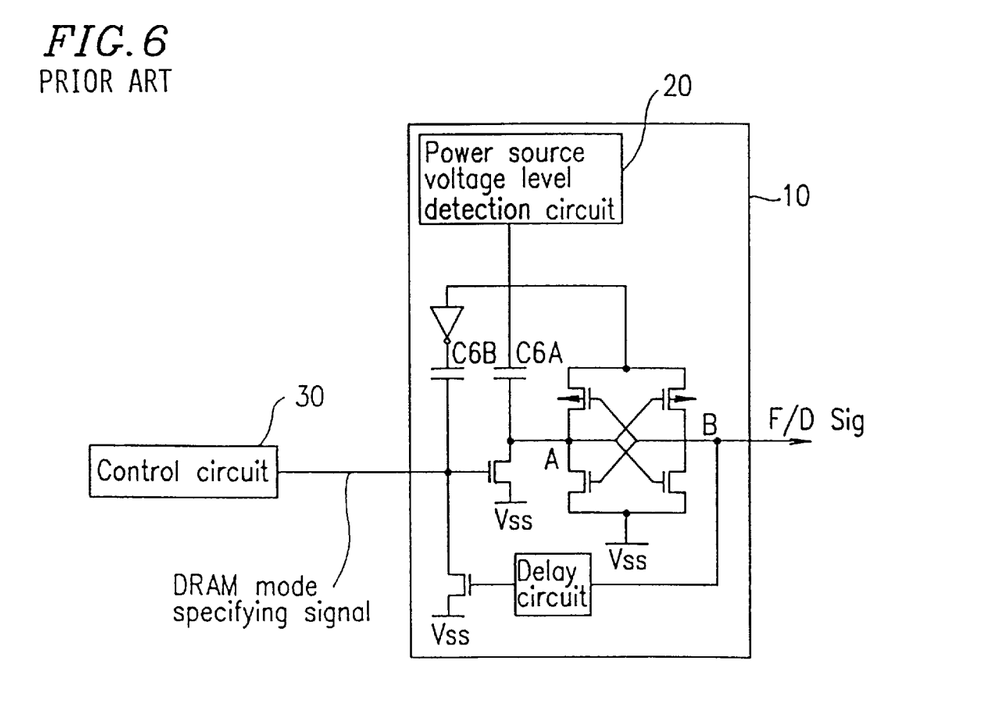
FIG. 6 is a circuit diagram schematically showing a conventional example of a configuration of an operation mode switching signal generating circuit of a ferroelectric memory.
Figure 7:
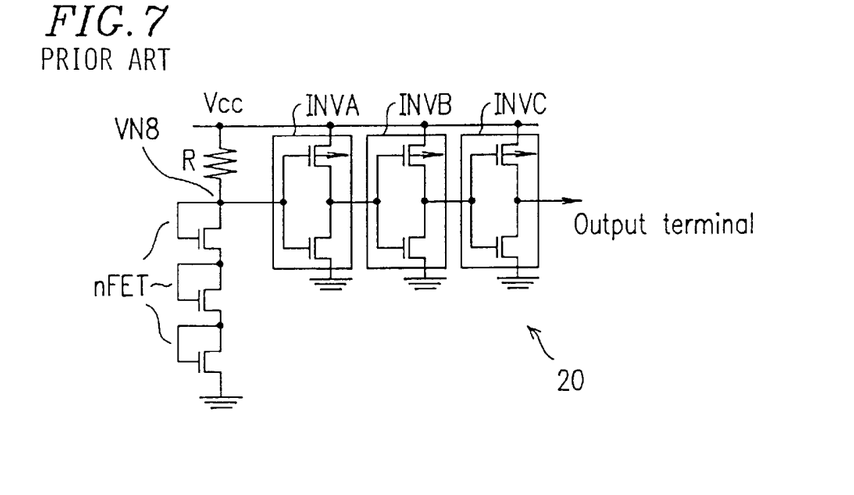
FIG. 7 is a circuit diagram schematically showing an exemplary configuration of conventional power source voltage level detection circuit included in the operation mode switching signal generating circuit in FIG. 6.

FIG. 6 shows a configuration of an operation mode switching signal generating circuit 10 included in the semiconductor memory device disclosed in the above-mentioned publication. The operation mode switching signal generating circuit 10 includes a power source voltage level detection circuit 20 and is supplied with a DRAM mode specifying signal (described later) from a control circuit 30. As schematically shown in FIG. 7, the power source voltage level detection circuit 20 includes a fixed resistor R connected between a power source voltage Vcc on a high potential side and a node VN8, three n-channel field effect transistors nFET connected in series between the node VN8 and a ground potential, and three inverters INVA, INVB, and INVC connected in series between the node VN8 and an output terminal.

Figure 8:
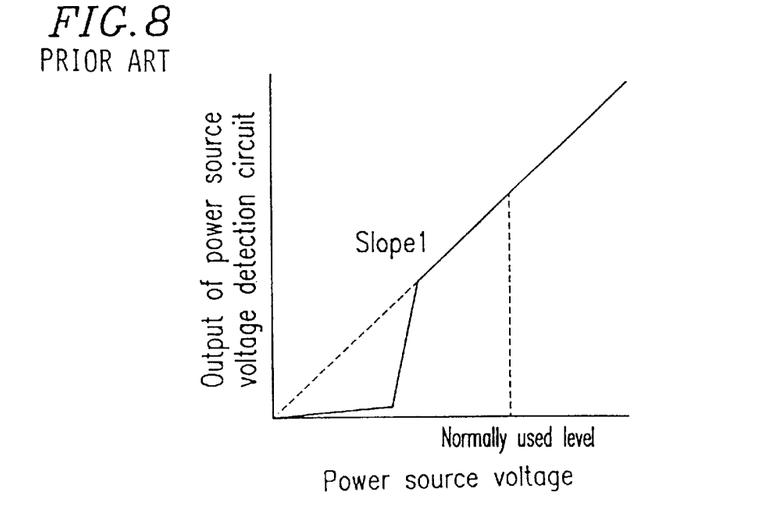
FIG. 8 is a graph schematically showing output characteristics of the power source voltage level detection circuit in FIG. 7.

FIG. 8 schematically shows output characteristics of the power source voltage level detection circuit 20. As shown in FIG. 8, while a power source voltage is at a low level, an output of the power source voltage level detection circuit 20 is also at a low level. On the other hand, when the power source voltage exceeds a predetermined value turning the power on, the power source voltage level detection circuit 20 generates a voltage at a high level equal to a power source voltage value at that time, as represented by a straight line with a slope of 1 in FIG. 8.

When the output of the power source voltage level detection circuit 20 is switched to a high level, the electric potential of a node A included in the operation mode switching signal generating circuit 10 becomes high through a capacitor C6A. In response to this change, an operation mode switching signal F/DSig supplied from a node B becomes low, whereby the semiconductor memory device is set in the non-volatile operation mode. On the other hand, for switching the non-volatile operation mode thus set to the volatile operation mode, the DRAM mode specifying signal at a high level is output to the operation mode switching signal generating circuit 10 from the control circuit 30. AS a result, a transistor connected to the node A becomes conductive, and the electric potential of the node A becomes low. In response to this change, the operation mode switching signal F/Dsig supplied from the node B becomes high, whereby the semiconductor memory is set in the volatile operation mode.

Thus, in the configuration disclosed in the above-identified publication, the operation modes are automatically switched in accordance with changes in the power source voltage level.

Upon evaluating operational characteristics of a ferroelectric memory, power source voltages in a wider range than that used for normal operation are sometimes applied to the ferroelectric memory so as to perform operational tests thereof. For example, in order to evaluate the margin from a designed specific value of a power source voltage to know accuracy in design, it is sometimes required to arbitrarily set the ferroelectric memory in a volatile operation mode independently from the changes in a power source voltage, thereby evaluating the resultant margin.

However, in the conventional ferroelectric memory as disclosed in the above-mentioned publication, the operation modes are automatically switched in accordance with the changes in the power source voltage. Thus, the evaluation (the operation test) which requires the volatile operation mode to be arbitrarily set independently from the changes in the power source voltage cannot be performed.

Furthermore, the upper limit value and the lower limit value of a power source voltage which can be actually applied to a ferroelectric memory are determined depending upon the polarization inversion characteristics and charge retention characteristics of a ferroelectric material forming a ferroelectric film. For example, in the ferroelectric capacitor formed using a ferroelectric material, when the amount of electric charges accumulated in the capacitor excessively increases, i.e., the deviation in thicknesses of the ferroelectric film becomes large (in general, the thickness becomes thinner), at the charge-sharing when the accumulated electric charges are discharged from the ferroelectric capacitor to bit lines via switching transistors, the bit lines are charged with the discharged electric charges. As a result, a potential difference between the thus charged bit lines and the electrode plate of the ferroelectric capacitor becomes small, resulting in difficulty in rewriting into the capacitor included in the memory cell. Thus, there is an upper limit to a power source voltage to be applied.

For the reasons as described above, a power source voltage in the range which is given as specifications to be realized may not be actually applied to a ferroelectric memory.

SUMMARY OF THE INVENTION

The semiconductor memory device of this invention, includes: a ferroelectric memory having a non-volatile operation mode and a volatile operation mode; an input terminal to which an input signal indicating a voltage level of a power source voltage is input; a first signal generating circuit outputting a first control signal for regulating activation and inactivation of the non-volatile operation mode to the ferroelectric memory; and a second signal generating circuit outputting a second control signal for regulating the activation and inactivation of the non-volatile operation mode to the first signal generating circuit, based on the input signal. The non-volatile operation mode and the volatile operation mode are automatically switched with each other in accordance with changes in the voltage level of the power source voltage under a first operation condition, and only the volatile operation mode is activated under a second operation condition.

In one embodiment, the second signal generating circuit includes a retaining circuit which retains information indicating whether the non-volatile operation mode is activated or inactivated. An output signal from the retaining circuit can be given to the first signal generating circuit as the second control signal. The second signal generating circuit can further include a voltage level detection circuit for recognizing the input signal to be at a high voltage level when the input signal has a voltage level higher than a predetermined voltage level, and an output signal from the voltage level detection circuit is given to the latch circuit.

Thus, the invention described herein makes possible the advantage of providing a semiconductor memory device configured in such a manner that a volatile operation mode and a non-volatile operation mode can be switched therebetween depending upon the operating condition: in one condition, the switch is made automatically in accordance with changes in a power source voltage; and in another condition, the switch is made forcefully with a control signal independently from the changes in the power source voltages.

This and other advantages of the present invention will become apparent to those skilled in the art upon reading and understanding the following detailed description with reference to the accompanying figures.

DESCRIPTION OF THE PREFERRED EMBODIMENTS

In order to achieve the above-mentioned advantage, it is required that switching of the operation modes is automatically conducted based on changes in the power source voltages under a certain operation condition. It is also required to allow only the volatile operation to be conducted without allowing the non-volatile operation to be conducted, under another operation condition, e.g., during normal operation. According to the present invention, the semiconductor memory device provided with a ferroelectric memory having the non-volatile operation mode and the volatile operation mode includes a first signal generating circuit which outputs a first control signal for controlling activation/inactivation of the non-volatile operation mode to the ferroelectric memory, and a second signal generating circuit which outputs a second control signal for controlling the activation/inactivation of the non-volatile operation mode to the first signal generating circuit based on input signals indicating levels of the power source voltage. Under the first operation condition, the non-volatile operation mode and the volatile operation mode are automatically switched in accordance with the changes in the power source voltage, while under the second operation condition, only the volatile operation mode is activated.

More specifically, an operation mode switching signal generating circuit is provided as the first signal generating circuit to be included in the operation mode switching signal generating circuit system. Moreover, two power source voltage level detection circuits each detecting that the power source voltage exceeds a predetermined voltage level (e.g., the power voltage level Vcc on a high potential side), and a latch circuit (a retaining circuit) receiving the output signal from these detection circuits, are provided as the second signal generating circuit included in the operation mode switching signal generating circuit system. The two power source level detection circuits may be omitted. The output signal from the latch circuit works as an operation mode switching signal. This configuration makes it possible to forcefully set the volatile operation mode and to conduct the operation margin test of the power source voltage.

As described above, according to the present invention, the non-volatile operation mode can be forcefully activated or inactivated independently from the changes in the power source voltage in accordance with combinations of two external input signals respectively input to the two power source voltage level detection circuits included in the operation mode switching signal generating circuit system. The information indicating whether the non-volatile operation mode is activated or inactivated is held by the latch circuit. Thus, in addition to the automatic switching of the operation modes based on the changes in the power source voltage, it is possible to conduct the volatile operation mode at a desired time forcefully and precisely.

The power source voltage level detection circuit used in the operation mode switching signal generating circuit system recognizes that the external input signal is at a high level only in the case where the external input signal indicating the level of the power source voltage is higher than a predetermined level. By combining the power source voltage level detection circuit having such a function with the external the input signals indicating the level of the power source voltage, input terminal for receiving the external input signal can also be used for other purposes, whereby the circuit configuration can be simplified.

Hereinafter, the present invention will be described by way of an illustrative example with reference to the drawings.

Figure 1:
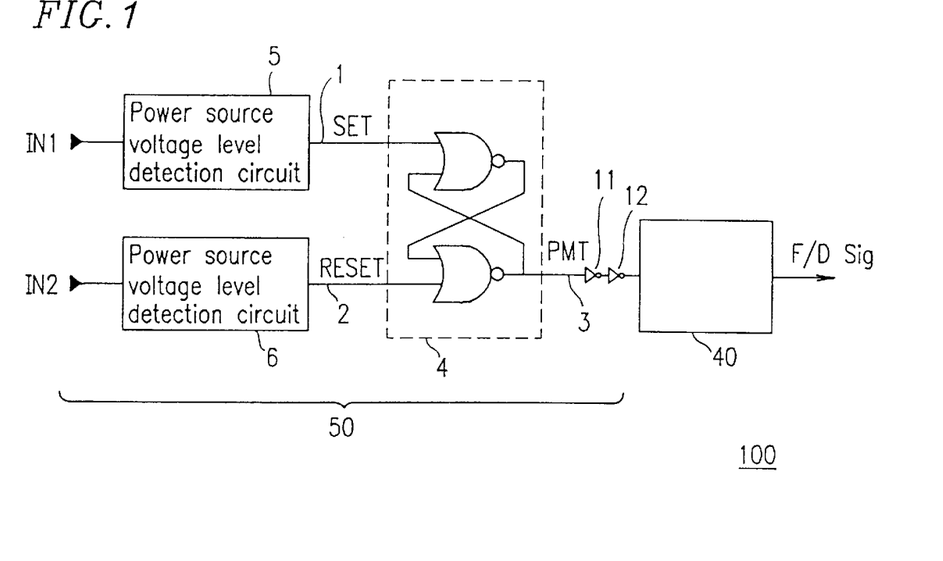
FIG. 1 is a circuit diagram schematically showing an exemplary configuration of an operation mode switching signal generating circuit system included in a ferroelectric memory which is a semiconductor memory device of the present invention.

FIG. 1 is a circuit diagram showing a configuration of an operation mode switching signal generating circuit system 100 in accordance with the principle of the present Invention.

The circuit system 100 shown in FIG. 1 supplies an operation mode switching signal F/Dsig to a ferroelectric memory (not shown in FIG. 1; hereinafter also referred to as the "semiconductor memory"). Specifically, the circuit system 100 includes a first signal generating circuit 40 which actually provides the semiconductor memory with the operation mode switching signal (the first control signal) F/DSig and a second signal generating circuit 50 which provides its output to the first signal generating circuit 40. Upon inputting external input signals IN1 and IN2 indicating the level of the power source voltage to the second signal generating circuit 50, activation/inactivation of the first signal generating circuit 40 is controlled. In accordance with this control, operation modes of the semiconductor memory are determined.

Detailed configuration of the first signal generating circuit 40 is described later.

The second signal generating circuit 50 includes power source voltage level detection circuits 5 and 6, a retaining circuit (a latch circuit) 4, and inverter circuits 11 and 12. The power source voltage level detection circuits 5 and 6 have a function of supplying output signals SET and RESET at a high level through output terminals 1 and 2, respectively, when the external input signals IN1 and IN2 each indicating the level of the power source voltage exceeds a predetermined voltage level, for example, a power source voltage Vcc on a high potential side. For example, when the external input signal IN1 to the power source voltage level detection circuit 5 reaches a predetermined voltage level or higher, the output signal SET at a high level is output through the output terminal 1 of the power source voltage level detection circuit 5. Similarly, when the external input signal IN2 to the power source voltage level detection circuit 6 reaches a predetermined voltage level or higher, the output signal RESET at a high level is supplied through the output terminal 2 of the power source voltage level detection circuit 6.

The output signals SET and RESET are respectively supplied to input terminals of a NOR-type latch circuit 4. An output signal PMT is output from an output terminal 3 of the latch circuit 4, and is supplied to the first signal generating circuit 40 through inverter circuits 11 and 12 connected in series to each other.

The output signal PMT from the latch circuit 4 is a signal indicative of information whether the first signal generating circuit 40 should be activated or inactivated, i.e., whether the operation modes should be automatically switched based on the power source voltage level or forcefully set in the volatile operation mode. The first signal generating circuit 40 generates and provides to the semiconductor memory, as the operation mode switching signal F/DSig, a signal for automatically switching between the non-volatile operation mode and the volatile operation mode of the semiconductor memory in accordance with the received second control signal PMT. Alternatively, the first signal generating circuit 40 generates and provides the semiconductor memory, as the operation mode switching signal F/DSig, a signal for forcefully setting the operation modes between the non-volatile operation mode and the volatile operation mode of the semiconductor memory in accordance with the received second control signal PMT. The operation mode switching signal F/DSig, which is supplied from the first signal generating circuit 40 to the semiconductor memory as described above, is also referred to as a first control signal.

It is determined by the external input signals IN1 and IN2 whether the operation modes should be automatically switched or forcefully set. More particularly, for example, with the external input signal IN1 of a high level (which is a supervoltage level beyond the power source voltage Vcc, as described later) and the external input signal IN2 of a low level, the volatile operation mode is forcefully set. With the external input signal IN1 of a low level and the external input signal IN2 of a high level which is a supervoltage level, the operation modes are automatically switched.

The operation of the circuit system 100 having the above-mentioned configuration will be further described below.

When the external input signal IN1 to the power source voltage level detection circuit 5 has a predetermined voltage level or higher, and the external input signal IN2 to the power source voltage level detection circuit 6 has a predetermined voltage level (e.g., ground potential GND) or lower, the output signal SET from the power source voltage level detection circuit 5 becomes high, and the output signal RESET from the power source voltage level detection circuit 6 remains at a low level. At this time, the output signal PMT from the latch circuit 4 becomes high, whereby the non-volatile operation mode is inactivated while the volatile operation mode is activated. Thus, it is possible to start evaluating the normal operation mode, i.e., the volatile operation mode of the semiconductor memory device after the completion of the operation of the circuit system 100.

When the voltage level of the external input signal IN2 to the power source voltage level detection circuit 6 exceeds a predetermined level after the completion of the normal operation, the output signal RESET from the power source voltage level detection circuit 6 becomes high. Consequently, the output signal PMT from the latch circuit 4 becomes low to activate the non-volatile operation mode of the semiconductor memory. At this time, switching of the operation mode does not depend upon the state of the external input signal IN1 to the power source voltage level detection circuit 5.

As described above, the circuit system 100 shown in FIG. 1 regulates activation and inactivation of the non-volatile operation mode of the semiconductor memory, when the power source voltage level detection circuits 5 and 6 receive the external input signals IN1 and IN2, each indicating the level of a power source voltage. As the external input signals IN1 and IN2, voltage signals having a predetermined level or higher when the power source voltage exceeds a predetermined voltage level (typically, the power source voltage Vcc on a high potential side) may be supplied. Thus, the input terminals of the external input signals IN1 and IN2 can also be used as input terminals for other purposes (e.g., an address input terminal, a control signal input terminal) to which a voltage signal having a voltage level between the power source voltage Vcc and the ground GND is input.

Figure 2:
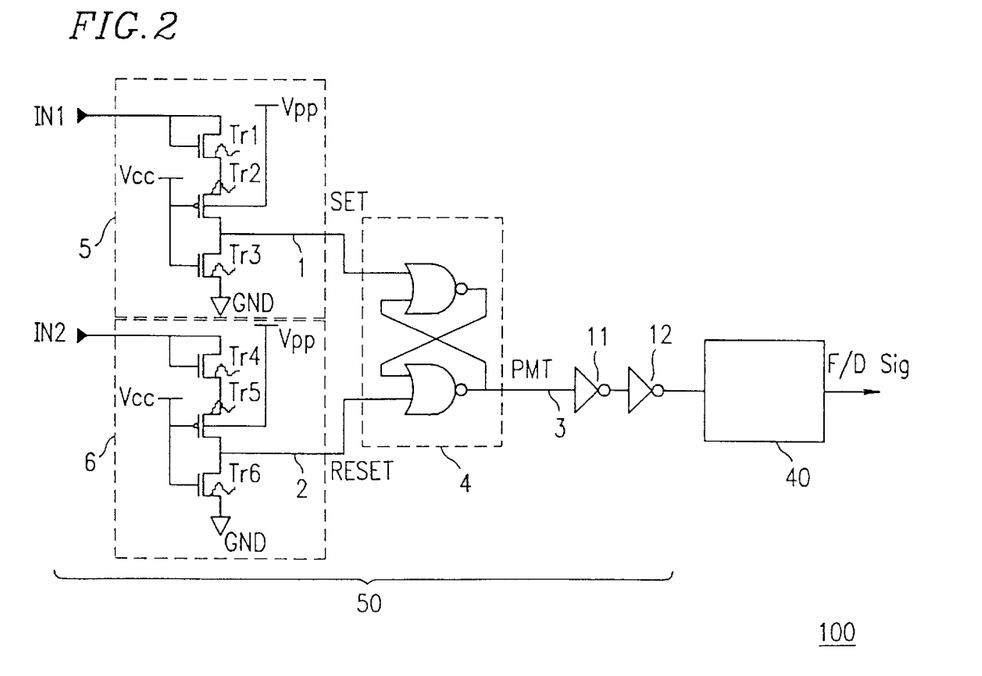
FIG. 2 is a circuit diagram showing an example of a detailed circuit configuration of the operation mode switching signal generating circuit system in FIG. 1.

FIG. 2 is a circuit diagram of the circuit system 100 in which the configurations of the power source voltage level detection circuits 5 and 6 are shown in detail.

In the power source voltage level detection circuit 5, three transistors Tr1 to Tr3 are connected in series between the input terminal to which the external input signal IN1 is given and a ground GND. The transistor Tr2 is supplied with a boosted power source voltage Vpp as a substrate voltage, having a level higher than that of the power source voltage Vcc on a high potential side. Gates of the transistors Tr2 and Tr3 are connected to the power source voltage Vcc on a high potential side. The output signal SET is output from an output terminal 1 provided between the transistors Tr2 and Tr3.

Similarly, in the power source voltage level detection circuit 6, three transistors Tr4 to Tr6 are connected in series between the input terminal to which the external input signal IN2 is given and a ground GND. The transistor Tr5 is supplied with a boosted power source voltage Vpp as a backgate voltage, having a level higher than that of the power source voltage Vcc on a high potential side. Gates of the transistors Tr5 and Tr6 are connected to the power source voltage Vcc on a high potential side. The output signal RESET is output from an output terminal 2 provided between the transistors Tr5 and Tr6.

Herein, the transistors Tr1, Tr3, Tr4, and Tr6 are N channel transistors, and the transistors Tr2 and Tr5 are P channel transistors. Thus, all three transistors Tr1 to Tr3 turn on in the power source voltage level detection circuit 5 when the external input signal IN1 exceeds the total of the power source voltage Vcc and threshold voltages Vtn and vtp (i.e., Vcc+Vtn+Vtp), where Vtn and Vtp represent threshold voltages of the N channel transistor and P channel transistor. In this situation, the output signal SET is set at a high level by appropriately setting the ON resistance ratio of the transistors Tr1 to Tr3. On the other hand, when the external input signal IN1 to the power source voltage level detection circuit 5 becomes low, the transistor Tr3 keeps an on-state while the transistors Tr1 and Tr2 turn off. Consequently, the output signal SET becomes low.

Similarly, all the three transistors Tr4 to Tr6 turn on in the power source voltage level detection circuit 6 when the external input signal IN2 exceeds the total of the power source voltage Vcc and the threshold voltages Vtn and Vtp (i.e., Vcc+Vtn+Vtp). In this situation, the output signal RESET is set at a high level by appropriately setting the ON resistance ratio of the transistors Tr4 to Tr6. On the other hand, when the external input signal IN2 to the power source voltage level detection circuit 6 becomes low, the transistor Tr6 keeps an on-state while the transistors Tr4 and Tr5 turn off. Consequently, the output signal RESET becomes low.

The configuration of the operation mode switching signal generating circuit system 100 as described above is merely one embodiment of the present invention. As is appreciated, the operation mode switching signal generating circuit system 100 can have another configuration. For example, latching information which shows activation/inactivation of the non-volatile operation mode, detecting a power source voltage level, setting the operation modes based on the detected result, etc., can be realized by methods different from those described above.

Figure 3:
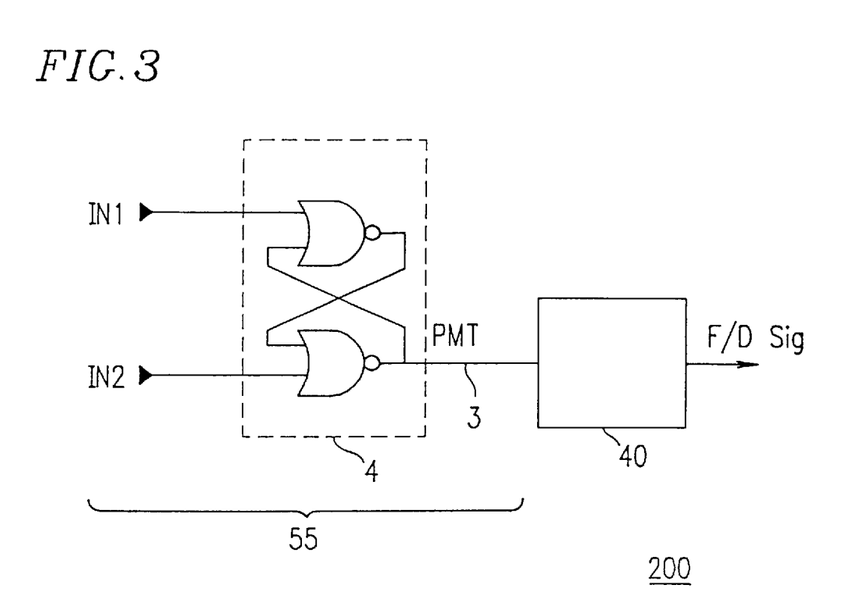
FIG. 3 is a circuit diagram schematically showing another exemplary configuration of the operation mode switching signal generating circuit system included in the ferroelectric memory which is the semiconductor memory device of the present invention.

An operation mode switching signal generating circuit system 200 shown in FIG. 3 corresponds to the operation mode switching signal generating circuit system 100 in which the power source voltage level detection circuits 5 and 6 are omitted so that the external input signals IN1 and IN2 are directly input to the latch circuit 4. In this configuration, the same effect as that of the operation mode switching signal generating circuit system 100 can be obtained.

In the case of the operation mode switching signal generating circuit system 200, it is required that the input terminals of the external input signals IN1 and IN2 are provided separately from input terminals for other purposes. The reason therefor is to prevent the non-volatile operation mode of the semiconductor memory device from being activated or inactivated by the external input signals IN1 and IN2 having a normal power source voltage level (i.e., Vcc or Vss).

Figure 4:
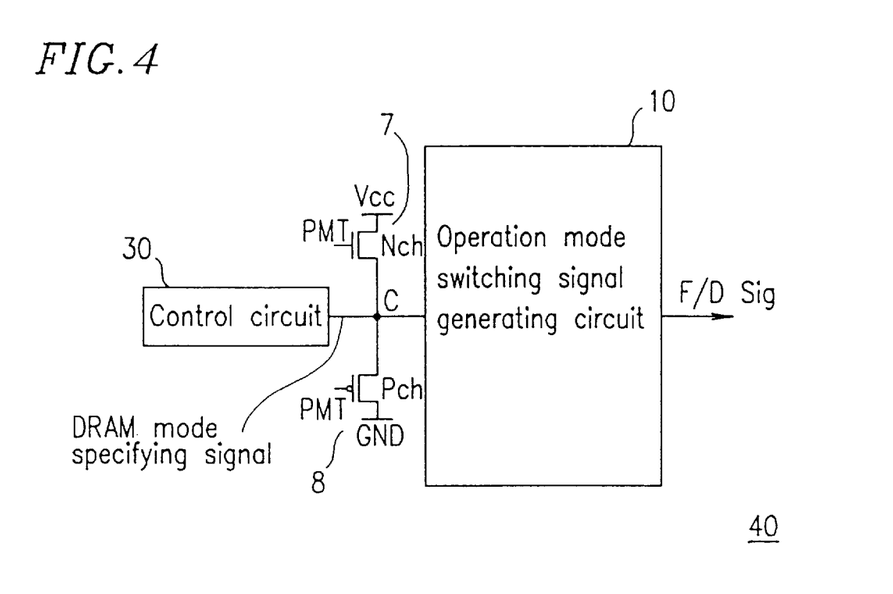
FIG. 4 is a circuit diagram schematically showing an exemplary configuration of a first signal generating circuit included in the ferroelectric memory which is the semiconductor memory device of the present invention.

FIG. 4 schematically illustrates the configuration of the first signal generating circuit 40 which is included in the circuit systems 100 and 200.

The first signal generating circuit 40 includes an operation mode switching signal generating circuit 10, a control circuit 30, and a pair of transistors. Among these components, the operation mode switching signal generating circuit 10 and the control circuit 30 can be configured to have the same configuration as disclosed in Japanese Laid-Open Patent Publication NO. 7-182872 which has been previously described with reference to FIGS. 6 and 7. FIG. 4 is a schematic view showing the connection of other circuit components to the operation mode switching signal generating circuit 10.

More specifically, the operation mode switching signal generating circuit 10 is connected to the control circuit 30 which supplies a DRAM mode specifying signal. A node C is provided between the control circuit 30 and the operation mode switching signal generating circuit 10, an N channel transistor 7 is provided between a power source voltage Vcc and the node C, and a P channel transistor 8 is provided between a ground GND and the node C. The output signal PMT of the latch circuit 4 is input to gates of the transistors 7 and 8.

As is apparent from the configuration shown in FIG. 4, when the output signal PMT from the latch circuit 4 becomes high, the N channel transistor 7 becomes conductive so that the electric potential of the node C becomes high. Then, the DRAM mode specifying signal becomes high. AS a result, a switching signal output from the operation mode switching signal generating circuit 10 is set so as to activate the volatile operation mode. On the other hand, when the output signal PMT from the latch circuit 4 becomes low, the P channel transistor 8 becomes conductive so that the electric potential of the node C becomes low. Then, the DRAM mode specifying signal becomes low. As a result, the switching signal output from the operation mode switching signal generating circuit 10 is set so as to inactivate the volatile operation mode.

As described above, in the circuit configuration shown in FIG. 4, when the output signal PMT from the latch circuit 4 becomes high, the DRAM mode specifying signal automatically becomes high to activate the volatile operation mode.

Figure 5:
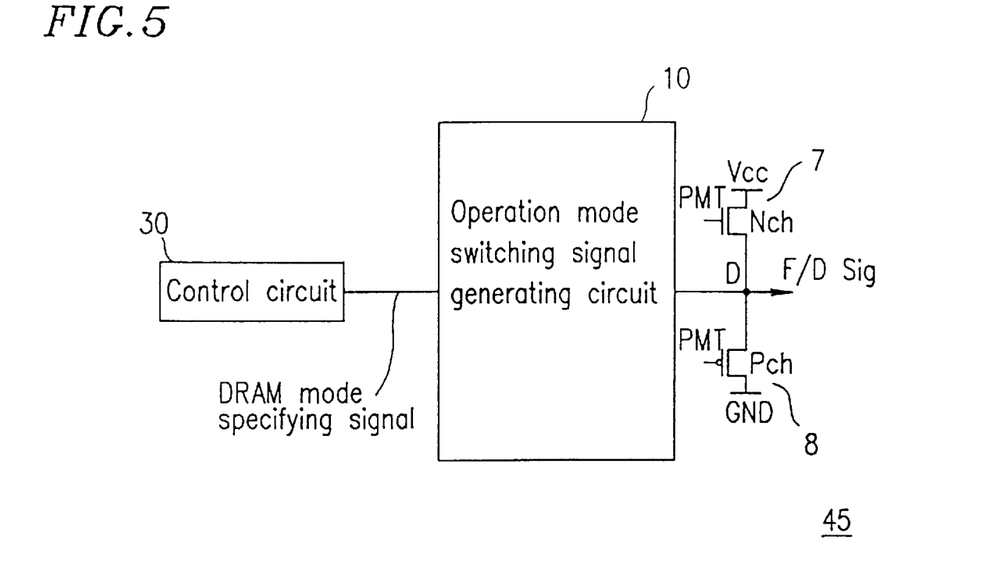
FIG. 5 is a circuit diagram schematically showing another exemplary configuration of the first signal generating circuit included in the ferroelectric memory which is the semiconductor memory device of the present invention.

FIG. 5 schematically illustrates the configuration of another first signal generating circuit 45 in which the circuit constituents are connected to the operation mode switching signal generating circuit 10 in a different manner from the case shown in FIG. 4.

In this case, the control circuit 30 supplying the DRAM mode specifying signal is also connected to the operation mode switching signal generating circuit 10. A node D is provided between the operation mode switching signal generating circuit 10 and an output terminal thereof, an N channel transistor 7 is provided between a power source voltage Vcc and the node D, and a P channel transistor 8 is provided between a ground GND and the node D. The output signal PMT of the latch circuit 4 is input to gates of the transistors 7 and 8.

As is apparent from the configuration shown in FIG. 5, when the output signal PMT from the latch circuit 4 becomes high, the N channel transistor 7 becomes conductive so that the electric potential of the node D becomes high. As a result, a switching signal output from the operation mode switching signal generating circuit 10 becomes high so as to activate the volatile operation mode. On the other hand, when the output signal PMT from the latch circuit 4 becomes low, the P channel transistor 8 becomes conductive so that the electric potential of the node D becomes low. As a result, the switching signal output from the operation mode switching signal generating circuit 10 becomes low so as to inactivate the volatile operation mode.

As described above, in the circuit configuration shown in FIG. 5, when the output signal PMT from the latch circuit 4 becomes high, the switching signal automatically becomes high to activate the volatile operation mode. Particularly in the configuration shown In FIG. 5, switching between the non-volatile operation mode and the volatile operation mode can be automatically conducted without being influenced by the operation mode switching signal generating circuit 10.

As described above, the semiconductor memory device of the present invention includes the operation mode switching signal generating circuit system which switches the operation modes of the ferroelectric memory between the non-volatile operation mode and the volatile operation mode upon receiving the external input signal indicating the level of a power source voltage. More specifically, the operation mode switching signal generating circuit system includes an operation mode switching signal generating circuit as the first signal generating circuit, as well as a power source voltage detection circuit and a latch circuit, for example, as the second signal generating circuit. Because of this configuration, it is possible to select the case where the non-volatile operation mode and the volatile operation mode are automatically switched in accordance with the level of the power source voltage and the case where only the volatile operation made is set.

As a result, under normal operation, the semiconductor memory can function as a volatile memory (for example, as a DRAM) by selecting the volatile operation mode, thereby writing and reading information through the accumulation and discharge of electric charges. Consequently, the number of occurrences of polarization inversion in the ferroelectric film is reduced, thereby realizing advantages such as preventing deterioration in operational characteristics of the ferroelectric film, prolonging life of the semiconductor memory, or the like.

Furthermore, according to the aforementioned configuration, the volatile operation mode can be arbitrarily set independently from the changes in the power source voltage level. Thus, the semiconductor memory device of the present invention can be subjected to an operation test conducted by applying a power source voltage in a wider range than that used for ordinary operation. Specifically, the semiconductor memory device can be subjected to an evaluation test for obtaining the margin from the designed value of a power source voltage.

Still furthermore, as the external input signal used for switching the operation modes, a voltage signal capable of having a level higher than the power source voltage Vcc on a high potential side in accordance with the changes in the power source voltage levels can be used. At this time, when a power source voltage level detection circuit is provided, the input terminal thereof can also be used for receiving a voltage signal for another purpose having a level between the power source voltage Vcc and the ground voltage GNP.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
   a ferroelectric memory having a non-volatile operation mode and a volatile operation mode;
   first and second input terminals to which first and second input signals each indicating a voltage level of a power source voltage are respectively input;
   a first signal generating circuit outputting a first control signal for regulating activation and inactivation of the non-volatile operation mode to said ferroelectric memory; and
   a second signal generating circuit outputting a second control signal for regulating the activation and inactivation of the non-volatile operation mode to said first signal generating circuit, based on the first and second input signals,
   the non-volatile operation mode and the volatile operation mode being automatically switched with each other in accordance with changes in the voltage level of the power source voltage under a first operation condition and only the volatile operation mode being activated under a second operation condition, the first and second operation conditions being set based on respective values of the first and second input signals.

2. The semiconductor memory device according to claim 1, wherein said second signal generating circuit comprises a retaining circuit which retains information indicating whether the non-volatile operation mode is activated or inactivated.

3. The semiconductor memory device according to claim 2, wherein an output signal from said retaining circuit is provided to said first signal generating circuit as the second control signal.

4. The semiconductor memory device according to claim 2, wherein said second signal generating circuit further comprises a voltage level detection circuit for recognizing the first and second input signals at a high voltage level when the first and second input signals have a voltage level higher than a predetermined voltage level, an output signal from the voltage level detection circuit being provided to said retaining circuit.

5. A semiconductor memory device comprising:

a ferroelectric memory operable in a volatile mode and a non-volatile mode in accordance with a mode signal;

mode switching means, coupled to said ferroelectric memory, for generating the mode signal in accordance with a control signal;

control means, coupled to said mode switching means, for generating the control signal to designate operation of said mode switching means in a first operating condition such that the mode signal is provided to automatically switch operation of said ferroelectric memory between the volatile mode and the non-volatile mode and in a second operating condition such that the mode signal is provided to forcibly maintain the operation of said ferroelectric memory in the volatile mode; and a power source for supplying a power source voltage to said ferroelectric memory, said control means generating the control signal in accordance with first and second input signals each indicative of a voltage level of the power source.

6. The semiconductor memory device of claim 5, wherein said control means comprises:

first power source voltage level detection means for detecting a voltage level of the first input signal and for providing a first signal indicative thereof;

second power source voltage level detection means for detecting a voltage level of the second input signal and for providing a second signal indicative thereof; and latch means, coupled to said first and second power source voltage level detection means, for retaining a signal indicative of whether the volatile mode or the non-volatile mode is active in accordance with the first and second signals and for outputting the retained signal as the control signal.

* * * * *